United States Patent [19]

Kameya

[11] Patent Number: 4,620,164
[45] Date of Patent: Oct. 28, 1986

[54] VARIABLE DELAY LINE HAVING LINKING ELECTRODE WITH DEPRESSIONS THEREIN FOR SNUG ENGAGEMENT OF MOVEABLE CONTACT

[75] Inventor: Kazuo Kameya, Tsurugashima, Japan

[73] Assignee: Elmec Corporation, Saitama, Japan

[21] Appl. No.: 666,301

[22] Filed: Oct. 30, 1984

[30] Foreign Application Priority Data

Nov. 2, 1983 [JP] Japan .............................. 58-170175[U]
Nov. 2, 1983 [JP] Japan .............................. 58-170176[U]
Nov. 18, 1983 [JP] Japan .............................. 58-178515[U]

[51] Int. Cl.⁴ .............................................. H03H 7/34
[52] U.S. Cl. .................................... 333/139; 333/140; 336/149
[58] Field of Search ............... 333/139, 140, 138, 156, 333/162, 149

[56] References Cited

U.S. PATENT DOCUMENTS

| 2,619,537 | 7/1950 | Kihn | 333/162 |
| 2,812,478 | 11/1957 | Allen | 336/149 X |
| 2,896,185 | 7/1959 | Blanco | 336/139 X |
| 3,173,111 | 3/1965 | Kallman | 333/162 |
| 3,602,846 | 8/1971 | Hauser | 333/138 |

FOREIGN PATENT DOCUMENTS 469332 4/1969 Switzerland ....................... 336/139

OTHER PUBLICATIONS

Data Delay Devices, Inc.; Delay Lines, Analog, Digital; Filters, Active, Passive; Catalog No. 82A; Digitally Programmable Delay Units.

Primary Examiner—Eugene R. LaRoche
Assistant Examiner—Benny Lee
Attorney, Agent, or Firm—Wegner & Bretschneider

[57] ABSTRACT

A variable delay line using a lumped constant type electromagnetic delay line and enjoying a superhigh-speed rising characteristic is disclosed, which comprises an inductance element formed by winding a conductor and possessed of a plurality of taps, a plurality of capacitors having electrodes thereof on one side kept in common connection, a plurality of linking electrodes disposed along the inductance element and adapted to interconnect the taps of the inductance element and the electrodes of the capacitors on the other side, fixed contacts formed of limited surface regions of the linking electrodes, and movable contact means adapted to advance on the fixed contacts while keeping pressed contact with each fixed contact so as to permit selection of the taps of the inductance element. The linking electrodes each incorporate therein a depression for receiving into snug engagement the movable contact means at the time that the movable contact means is set in pressed contact with the particular fixed contact selected.

3 Claims, 5 Drawing Figures

FIG. 1
FIG. 2
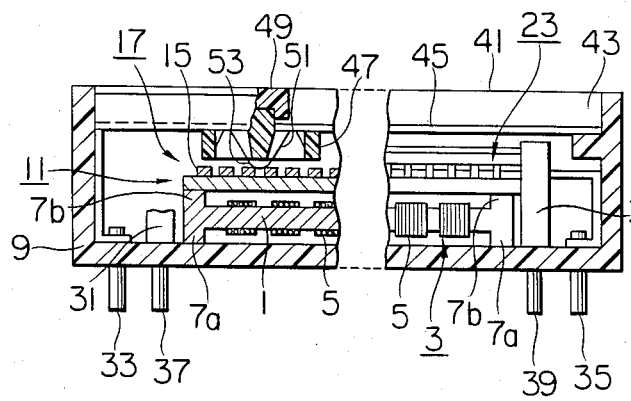
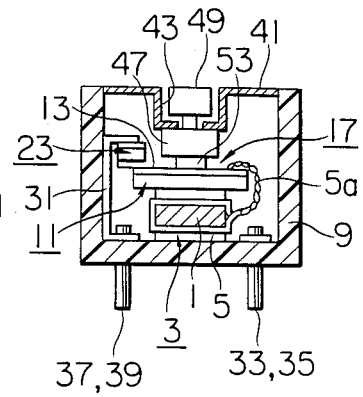
FIG. 3
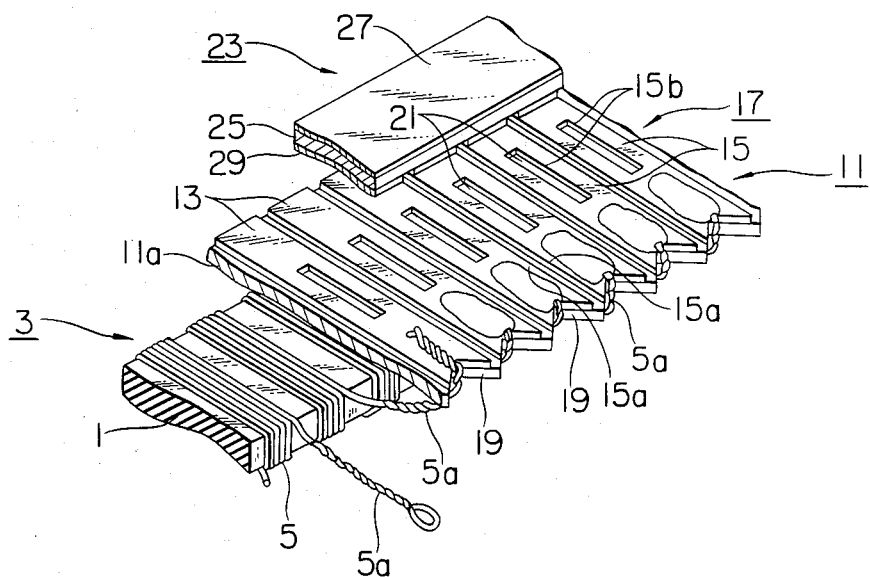

VARIABLE DELAY LINE HAVING LINKING ELECTRODE WITH DEPRESSIONS THEREIN FOR SNUG ENGAGEMENT OF MOVEABLE CONTACT

BACKGROUND OF THE INVENTION (1) Field of the Invention

This invention relates to a variable delay line using a lumped constant type electromagnetic delay line and enjoying a superhigh-speed rising characteristic. More particularly, this invention relates to improvements in and concerning a variable delay line which combines an inductance element formed of a wound conductor and possessed of a plurality of taps with a plurality of capacitors and, therefore, enables the delay time to be varied by suitably switching the taps.

(2) Description of the Prior Art

A superhigh-speed variable delay line is easily formed for example, by using an electromagnetic delay line which has a plurality of sections formed therein by fitting a plurality of taps on an inductance element produced by winding a conductor in a plurality of turns around a bar bobbin and connecting to these taps the first electrodes of a plurality of capacitors whose other electrodes are grounded in common connection.

Specifically, this variable delay line is completed simply by forming a plurality of fixed electrodes on an insulating panel disposed along the inductance element, connecting the taps of the inductance element to these fixed electrodes, and disposing a movable contact member in such a manner that it may be moved along the row of these fixed electrodes as to be kept in pressed contact with each fixed electrode one after another.

In the variable delay line of this nature, however, there is a possibility that when the delay line is exposed to some external vibration or impact and if the fixed electrodes are flat, the movable contact held in pressed contact with one of these fixed electrodes will move and come into contact with some other fixed electrode. As the result, the delay time once selected will vary easily. When these fixed electrodes are given an increased width, the movable contact is not so readily moved from one to another of the fixed electrodes by the external vibration or impact, and the delay time once selected is not so easily varied. The increased width, however, results in an inevitable addition to the overall size of the delay line. Desired enhancement of the increment resolution of delay time is fulfilled by increasing the number of taps and that of fixed electrodes. In this case, the increased width of fixed electrodes enlarges the size of the delay line.

Further, the connection of a plurality of capacitors to the taps of the inductance element turns out to be a difficult.

SUMMARY OF THE INVENTION

This invention has been produced for the purpose of solving these problems.

A primary object of this invention is to provide a compact variable delay line so constructed that once the movable contact member is brought into contact with each selected fixed contact, the movable contact member is not easily moved out of position on exposure to external vibration or impact, and the selected delay time is retained stably.

Another object of this invention is to provide a variable delay line which is easy to manufacture and permits easy connection between the inductance element and the capacitors.

Yet another object of this invention is to provide a variable delay line of minimal loss.

To accomplish the objects described above, the variable delay line of the present invention comprises an inductance element formed by winding a conductor and provided with a plurality of taps, a plurality of linking electrodes arranged along the inductance element, a plurality of capacitors having electrodes on one side which are in common ground connection and having electrodes on the other side which are connected, in conjunction with the aforementioned taps, by the aforementioned linking electrodes, fixed contacts formed of limited surface regions of the linking electrodes, and movable contact means adapted to be moved along the row of fixed contacts so as to be kept in pressed contact with each fixed contact so as to permit selection of the taps of the inductance element, with the linking electrodes each adapted to incorporate therein a depression for receiving into snug engagement the movable contact means at the time that the movable contact means is set in pressed contact with the particular fixed contact selected.

Owing to the construction of this invention described above, since the fixed contact regions with which the movable contact means comes into contact, each possessing a depression for receiving the movable contact means into snug engagement, the movable contact means is allowed to move along the row of fixed contacts while repeating its snug engagement with the depression on each fixed contact. Once the movable contact means is set in contact with one particular fixed contact selected, therefore, it is not easily moved from the fixed contact even on exposure to external vibration or impact and the delay time once fixed is retained stably.

The other objects and effects of this invention will become apparent from the further disclosure of the invention to be made in the following detailed description of a preferred embodiment with reference to the accompanying drawings.

BRIEF DESCRIPTION OF THE DRAWINGS

FIG. 1 is a partially sectioned front view of a variable delay line as one embodiment of this invention.

FIG. 2 is a partially sectioned side view of the variable delay line of this invention illustrated in FIG. 1.

FIG. 3 is a partial perspective view, illustrating the state of mutual connection among the inductance element, capacitors, and linking electrodes of the variable delay line of FIG. 1.

DETAILED DESCRIPTION OF THE PREFERRED EMBODIMENT

Figure 4:
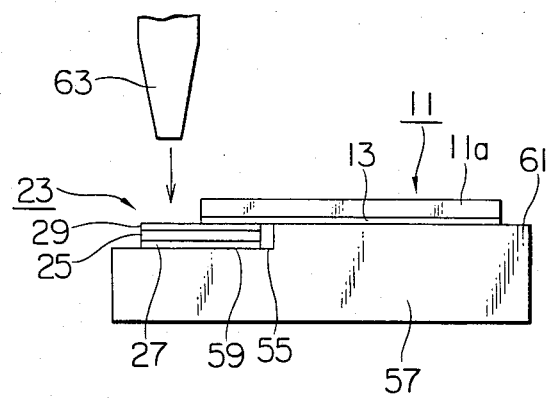
FIG. 4 is a side view illustrating a typical method for connecting the capacitors to the linking electrodes in the variable dealy line of FIG. 1.

Now, the present invention will be described in detail below.

As illustrated in FIG. 1 and FIG. 2, an inductance element 3 is formed on a slender bar-like nonmagnetic bobbin 1. This inductance element 3 has a conductor wound around the bobbin 1 in one layer in such a pattern as to give rise to plurality of regularly spaced coils 5 each consisting of a plurality of turns of the conductor, with the lead wires 5a of the conductor from the adjacent coils 5 twisted around each other in series connection. The twisted lead wires 5a serve as taps of the inductance element 3.

At each of the opposite ends of the bobbin 1, projections 7a, 7b thrust out of the opposite lateral faces. The projections 7a which are raised in one direction from the opposite ends of the bobbin 1 rest on the inner bottom face of a box-shaped case 9 to keep the bobbin 1 lying horizontally within the case 9.

The projections 7b thrust upwardly from opposite ends of the horizontally lying bobbin 1 and attached thereon are the opposite ends of a printed board 11 which is laid over the bobbin 1 to bridge it. This printed board 11, as illustrated in FIG. 3, has on one main surface (upper surface in the diagram) of a flat oblong insulating substrate 11a a plurality of linking electrodes 13 elongated perpendicularly to the direction of the length of the insulating substrate 11a and arranged parallel to one another as regularly spaced.

The central regions on the front surface of these linking electrodes 13 constitute themselves fixed contacts 15 with which a movable contact member 51 to be described fully afterward comes into contact. These fixed contacts 15 on the linking electrodes 13 form a row of fixed contacts 17 arranged in the direction of the length of the printed board 11. Here, the gaps intervening between the adjacent linking electrodes 13, or the gaps between the adjacent fixed contacts 15, have a distance enough for part of the movable contact member 51 to fall down and come into contact with the opposed edges 15a of the adjacent fixed contacts 15.

On one of the opposite longitudinal edges of the printed board 11, V-shaped notches 19 are formed to the linking electrodes 13. In the regions of the linking electrodes 13 serving as fixed contacts 15, depressions 21 elongated in the direction of the width of the printed board 11 are formed at the center and in the direction of the width of each of the linking electrodes 13. These depressions 21 are formed with enough depth for the insulating substrate 11a to be exposed. They have a width enough for part of the movable contact member 51 to be admitted into engagement therewith and for the opposed edges 15b forming part of the depressions 21 to come into contact with the movable contact member 51.

The linking electrodes 13 possessing these depressions 21 may be formed from an ordinary printed board by photoetching. The notches 19 can be formed by pressing.

The twisted lead wires 5a are drawn out of the adjacent coils 5 and passed around the V-shaped notches 19 and are soldered on the sides and toward the notches on the end portions of the linking electrodes 13. To the ends of the linking electrodes 13 opposite the respective ends thereof having the lead wires 5a fastened by soldering, a composite capacitor 23 is connected.

This composite capacitor 23 is constructed by forming a common electrode 27 on the entire area of one main surface of a thin oblong dielectric board 25 and forming on the opposite main surface a plurality of capacity electrodes 29 with the same pitch as the linking electrodes 13. This composite capacitor 23 is supported in place as laid parallell to the inductance element 3, with part of the capacity electrodes 29 soldered to the ends of the linking electrodes as superposed thereon and, at the same time, the common electrode 27 connected to the leading end of a slender connecting plate 31 formed on the inner lateral surface of the case 9 as illustrated in FIG. 2. The composite capacitor 23, is set in place so as to protrude from the printed board 11 and is connected to the lead wires 5a of the coils 5 through the medium of the linking electrodes 13.

The individual capacitors formed in the composite capacitor 23 are connected to the inductance element 3 through the medium of the linking electrodes 13 to complete a lumped constant type delay line possessing a plurality of sections.

With reference again to FIG. 1 and FIG. 2, input and output terminals 33,35 and input and output side common terminals 37,39 are planted in the bottom of the case 9. To the input and output side common terminals 37,39 is connected the aforementioned connecting plate 31. The particular linking electrode 13 falling at one end of the row of fixed contacts 17 is connected to the output terminal 35, and the particular linking electrode 13 falling at the other end of the row of fixed contacts 17 is connected to the input side common terminal 37 through the medium of an inner terminal resistor Ro (not shown in FIG. 1 or FIG. 2).

The case 9 has an open top and a conductor board 41 is attached to the case 9 so as to close the open top. This conductor board 41 is connected to the input terminal 33. This conductor board 41 is bent to form a depressed part 43 along the row of fixed contacts 17. The conductor board 41 so forming the depressed part 43 has a slender groove 45 formed along the row of fixed contacts 17.

Between the conductor board 41 and the row of fixed contacts 17, an insulative holder 47 is disposed in such a manner that a projected part of this holder will thrust out of the groove 45. This holder 47, though not illustrated in detail, possesses a frame part and a bridge piece dividing the frame part in half. The projected part formed on the bridge piece is thrust through the groove 45 of the conductor board 41 into the depressed part 43 and, at the same time, a pinch 49 is attached to the projected part. Thus, the holder 47 is supported in place by the conductor board 41 by causing the conductor board 41 to be nipped between the frame part and the pinch 49.

The holder 47 accommodates therein a movable contact member 51 which is formed by bending a slender conductive piece arcuately enough to generate resiliency. The movable contact member 51 has the opposite end parts thereof held slidably in contact with the conductor board 41 and has the central arcuately bulged part thereof held, as a movable contact 53, resiliently in contact with the fixed contacts 15 one after another.

When the pinch 49 attached to the projected part of the holder 47 is moved along the groove 45 of the conductor board 41, the movable contact member 51 accumulates force of its own elastic deformation and consequently the movable contact 53 is urged by this force to advance while keeping contact with the depression 21 of each fixed contact 15 and with the gap between the fixed contacts 15 in one after another. To be more specific, the movable contact member 51 advances on the row of fixed contacts 17 while alternately repeating the simple contact with the opposed edges 15b defining the depression 21 of one fixed contact 15 and the complex contact with the opposed edges 15a of the adjacent fixed contacts 15. The input terminal 33, therefore, is electrically connected to the particular fixed contact (contacts) 15 selected through the medium of the conductor board 41 and the movable contact member 51.

Since the movable contact member 51 is urged by the fixed contact 15, it is not readily moved out of place by external vibration or impact so long as it remains in snug engagement with the depression 21. Further, while the movable contact member 51 is repeating contact with the gaps between the fixed contact and with the depression 21, it is enabled to operate with smooth clicks and obtain safe contact.

Moreover, high-frequency electric current generally tends not to flow evenly through its conductor, the current density is lower at the center of the conductor and is higher in the fringe region of the conductor. In the linking electrodes 13 which serve to connect the inductance element 3 and the composite capacitor 23 of the variable delay line of the present invention, therefore, any loss in terms of high frequency is hardly increased by forming the depressions 21 in the direction of the length except for part of the length.

Further, since part of the capacity electrodes 29 of the composite capacitor 23 superposed on the linking electrodes 13 protrudes from the printed board 11, the soldering iron can be applied directry upon the capacity electrodes 29 to be connected and the work of soldering can be carried out with ease. As the result, the operational efficiency of the connection between the linking electrodes 13 and the composite capacitor 23 is improved and the assembly of the variable delay line is facilitated. Since the composite capacitor 23 and the fixed contacts 15 are amply separated from each other, molten solder does not easily flow over the fixed contacts 15. Thus, the fixed contacts 15 are very rarely stained by the molten solder.

As means of soldering the composite capacitor 23 onto the linking electrodes 13, the method illustrated in FIG. 4 may be adopted, for example.

On a metallic base 57 possessing a stepped portion 55 of a height equalling the thickness of the composite capacitor 23, the composite capacitor 23 having a film of molten solder deposited in advance on the capacity electrodes 29 is mounted on a lower stage 59 of the metallic base 57 in such a manner that the capacity electrodes 29 will look upward, and the printed board 11 is mounted on the higher stage 61 in such a manner that the linking electrodes 13 will be partially superposed on the capacity electrodes 29. Then the tip of the soldering iron 63 is applied to the part of the capacity electrodes 29 on which the linking electrodes 13 are not superposed. Consequently, the linking electrodes 13 and the capacity electrodes 29 are easily joined because the film of solder on that part of the capacity electrodes 29 is melted and the film of solder on the part of the capacity electordes 29 now held in contact with the linking electrodes 13 is similarly melted. Since the heat in the fixed contact parts of the linking electrodes 13 is radiated through the base 57, the molten solder hardly flows over the fixed contacts. When the soldering iron 63 having a tip elongated in the direction of the composite capacitor 23 is adopted, the soldering of all the capacity electrodes 29 can be carried out all at once and the productivity is consequently improved.

In accordance with this invention which is constructed as described above, since the connection between the lead wires 5a of the inductance element 3 and the capacity electrodes 29 of the composite capacitor 23 is effected on the different points of linking electrodes 13, the solidified solder at the joined portions between the capacity electrodes 29 of the composite capacitor 23 and the linking electrodes 13 or between the lead wires 5a of the inductance element 3 and the linking electrodes 13 is not easily melted. Thus, the connection thus obtained by soldering can be retained stably.

Figure 5:
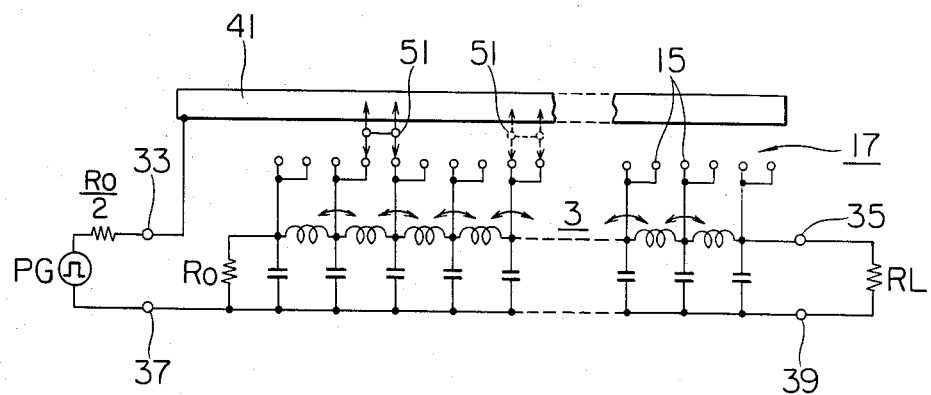
FIG. 5 is an equivalent circuit diagram of the variable delay line of this invention illustrated in FIG. 1.

Now, the operation of the variable delay line of the present invention will be described briefly with reference to FIG. 5 which is an equivalent circuit diagram of the delay line. In FIG. 5, the symbol RL denotes a load resistance connected between the output terminal 35 and the output side common terminal 39.

The input signal from the Pulse Generator PG is forwarded through the conductor board 41 and the movable contact member 51 and fed in the fixed contact (contacts) 15. At this point of input, the energy of the input signal is divided into two halves and propagated, one toward the left and the other toward the right with respect to the diagram. The signal propagated toward the right is fed out of the output terminals 35, 39 after elapse of a delay time which is the product of the unit delay time $t_d$ for one section multiplied by the number of sections lying toward the right side of the point of input and is absorbed by the terminal resistor RL as the load. When the movable contact member 51 is slid by moving the pinch 49 shown in FIG. 1, the delay time of the output signal from the output terminals 35,39 can be varied. In the meantime, the signal propagated toward the left of the delay line is consumed by the inner terminal resistor Ro inside the case 9 after elapse of a delay time which the product of the unit delay time multiplied by the number of sections lying toward the left from the point of input.

The preferred embodiment of the invention described above represents an aspect wherein the depressions 21 with which the movable contact member 51 comes into engagement are formed so as to expose the insulating substrate 11a in the regions of fixed contacts 15. Optionally, these depressions 21 may be formed in the linking electrodes 13 so as to keep the insulating substrate 11a unexposed or they may be formed in a depth such that they will reach the interior of the insulating substrate 11a. What is essential for the fulfillment of the objects of this invention is that in the fixed contacts 15 of the linking electrodes 13, these depressions 21 should be formed in the area to be passed by the movable contact member 51 in such a manner that the movable contact member 51 will come into engagement with the depressions one after another while repeating its contact with each fixed contact 15. These depressions may be in any desired shape. For example, they may be circular. The positions in which the depressions are formed may be so selected that they will transverse the area in which the movable contact member 51 advances. From the viewpoint of curbing possible growth of loss, however, the depressions are desired to be formed in the centers of the linking electrodes 13.

In the preferred embodiment described above, the inductance element 3 may be formed by forming in series connection a plurality of mutually coupled coils each wound in a spiral form or in a plurality of layers. Further, the present invention can be embodied in an m-derived delay line which comprises a plurality of inductance elements each formed by winding a conductor around a ferrite drum core and drawing out tap from selected portion of the wound conductor and a multiplicity of capacitors connected to one each of the taps of the inductance elements. The bobbin is not an essential component. As the conductor for the inductance element, any of the conductors of varying cross sections heretofore known to the art may be used. Optionally, the conductor may be formed by depositing a layer of conductive substance on the periphery of a bobbin and cutting a groove in the layer as by etching, for example.

The movable contact member 51 may be any means of movable contact so constructed that it will come into pressed contact with at least the fixed contacts 15 while repeating the simple contact with the fixed contacts 15 one after another.

Further in the aforementioned preferred embodiment, the capacity electrodes 29 of the composite capacitor 23 are joined to the linking electrodes 13 as parallelly superposed thereon. The connection between the capacity electrodes 29 and the linking electrodes 13 need not be limited to this particular manner but may be suitably changed for the purpose of improving the operational efficiency of the connection of the linking electrodes 13 to the composite capacitor 23. It goes without saying that separated capacitors may be used each for every tap of the inductance element.

Further, for the purpose of ensuring stable connection between the composite capacitor 23 and the linking electrodes 13 and between the lead wires 5a and the linking electrodes 13, the points of connection between the taps of the inductance element and the linking electrodes 13 and the points of connection between the capacitors and the linking electrodes 13 may be separated from each other without impairing the objects of this invention. In the linking electrodes 13, for example, the cpacitors may be connected between the points of connection of the taps with the linking electrodes 13 and the aforementioned depressions.

What is claimed is:

1. A lumped constant type variable delay line capable of varying the delay time of a superhigh-speed rise signal, comprising:

an inductance element formed by a winding of a conductor and having a plurality of taps thereon;

a plurality of capacitors, each capacitor having a ground electrode on one side connected in a common ground connection and a capacity electrode on the other side, a plurality of of linking electrodes disposed along said inductance element and adapted to interconnect said taps to said capacity electrodes of said plurality of capacitors, said linking electrodes having fixed contacts; and movable contact means adapted to advance while keeping in pressed contact with said fixed contacts, thereby permitting selection of particular ones of said taps of said inductance element;

said linking electrodes each incorporating therein a depression for receiving into snug engagement said movable contact means at the time that said movable contact means is set in place on the particular fixed contact element selected.

2. A variable delay line according to claim 1, wherein said taps of said inductance element and said capacitors are connected to each other by said linking electrodes.

3. A variable delay line according to claim 1, wherein the electrodes of said capacitors are formed on the opposed surfaces of a dielectric board, said capacitors are connected to said linking electrodes with one of the electrodes thereof superposed on said linking electrodes, and said capacitors protrude from said linking electrodes.

* * * * *